(12) United States Patent
Tanaka et al.

(10) Patent No.: US 7,216,271 B2
(45) Date of Patent: May 8, 2007

(54) TESTING APPARATUS AND A TESTING METHOD

(75) Inventors: Kouichi Tanaka, Tokyo (JP); Masaru Doi, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 158 days.

(21) Appl. No.: 11/097,982

(22) Filed: Apr. 1, 2005

(65) Prior Publication Data
US 2005/0249001 A1 Nov. 10, 2005

Related U.S. Application Data

(63) Continuation of application No. PCT/JP03/12462, filed on Sep. 30, 2003.

(30) Foreign Application Priority Data
Oct. 1, 2002 (JP) ............................. 2002-289284

(51) Int. Cl.
*G11C 29/00* (2006.01)
(52) U.S. Cl. ...................... 714/719; 714/715; 714/718; 714/736; 714/738; 714/744; 714/25; 714/745; 365/201; 702/108
(58) Field of Classification Search ..................... None
See application file for complete search history.

(56) References Cited

U.S. PATENT DOCUMENTS 4,928,278 A * 5/1990 Otsuji et al. ................ 714/700
5,153,883 A * 10/1992 Hayashi et al. ............. 714/744
5,978,949 A * 11/1999 Terayama .................... 714/738
6,061,816 A * 5/2000 Shimizu ...................... 714/738
6,377,065 B1 * 4/2002 Le et al. ...................... 324/765
6,457,148 B1 * 9/2002 Yoshiba ...................... 714/718

(Continued)

FOREIGN PATENT DOCUMENTS

JP 60-125573 7/1985

(Continued)

OTHER PUBLICATIONS

International Search Report for Internation Application No. PCT/JP03/12462 mailed on Jan. 20, 2004, 2 pages.

*Primary Examiner*—Guy Lamarre
*Assistant Examiner*—John P Trimmings
(74) *Attorney, Agent, or Firm*—Osha Liang LLP (57) ABSTRACT

A testing apparatus for performing a setup testing or a hold testing on a device under test ("DUT") storing a given data signal according to a given clock signal is provided, wherein the testing apparatus includes a timing generating unit for generating sequentially a plurality of timing signals having different timings during the setup testing or the hold testing on the basis of a fist offset value given before starting the setup testing or the hold testing; a pattern generating unit for generating the clock signal and the data signal; a pattern formatting unit for shifting the phase of the data signal with respect to the clock signal sequentially according to the timing signals sequentially generated and providing the DUT with the clock signal and the phase-shifted data signal sequentially; and a determining module for acquiring a setup time or a hold time of the DUT on the basis of storage data which are the data signals stored by the DUT.

10 Claims, 8 Drawing Sheets

U.S. PATENT DOCUMENTS 6,587,983 B1 * 7/2003 Nakayama .................. 714/736
2005/0022088 A1 * 1/2005 Nakayama .................. 714/744

FOREIGN PATENT DOCUMENTS

| JP | 64-84167 | 3/1989 |
| JP | 406324118 A * | 5/1993 |
| JP | 7-110359 | 4/1995 |
| JP | 2000-275309 | 10/2000 |
| JP | 2000292495 A * | 10/2000 |
| JP | 2001-27660 | 1/2001 |

* cited by examiner

TESTING APPARATUS AND A TESTING METHOD

The present application is a continuation application of PCT/JP2003/012462 filed on Sep. 30, 2003, claiming priority from a Japanese patent application No. 2002-289284 filed on Oct. 1, 2002, the contents of which are incorporated herein by reference.

BACKGROUND OF THE INVENTION

1. Field of the Invention

The present invention relates to a testing apparatus for performing a setup testing or a hold testing on a device under test. More particularly, the present invention relates to a testing apparatus which is able to perform a setup testing or a hold testing efficiently. In addition, the present invention relates to the following Japanese patent application. The present invention claims the benefit of, and priority to, Japanese patent application No. 2002-289284 filed on Oct. 1, 2002, the entire contents of which are incorporated herein by reference for all purposes.

2. Description of Related Art

Recently, a requirement of high operation speed and low cost of an electronic device is prominent. According to the high operation speed, it becomes difficult to secure a setup time and a hold time of data transfer between electronic devices.

In case of writing data from the outside onto an electronic device using a clock as a reference, the data from the outside should be stabilized for more than a predetermined time before an edge of the clock in order to certainly write the data from the outside onto the electronic device. The predetermined time is referred to a setup time. Further, the data from the outside should be in a stable state until more than a predetermined time passes since an edge of the clock. The predetermined time is referred to a hold time. In case the conditions of the setup time and the hold time are not satisfied, sometimes the electronic device cannot perform holding of the data correctly.

Thus, it is required to test whether or not the electronic device secures the setup time and the hold time. The testing is performed by using a testing apparatus. Recently, the ratio of a cost for the test of the electronic device to a manufacturing cost of the electronic device becomes larger. Thus, in order to reduce the testing cost, reduction of time for the testing and improvement of accuracy of the testing are required.

A conventional testing apparatus measures a setup time which is necessary for writing data from the outside onto an electronic device by shifting gradually phase of the data from the outside with respect to a clock and judging whether or not it is possible to write correctly the data from the outside onto the electronic device. Further, a hold time is measured in a similar way. The data from the outside is provided to the electronic device according to a timing signal generated by the testing apparatus. Thus, it is required to generate a plurality of timing signals of which phase shifts gradually in order to measure the setup time and the hold time.

The testing apparatus stores a timing setting data showing a timing at which the timing signal should be generated to correspond to the data of the outside to be written and generates the timing signal according to the timing setting data. In other words, in order to measure the setup time and the hold time, it is required to store the timing setting data corresponding to each of the plurality of timing signals.

However, it is difficult to store all the timing setting data corresponding to all of the plurality of timing signals which should be generated. In order to store all the timing setting data, a memory of large volume is required. The conventional testing apparatus includes a register which is able to store several timing setting data. In case of generating the timing signal of which phase shifts gradually, it is required to rewrite sequentially the timing setting data stored in the register.

However, since it is required to stop a test pattern applied from the testing apparatus to the electronic device in order to write a new timing setting data on the resister, a dead time is generated in the testing of the electronic device. Thus, the time for the testing increases. Further, the manufacturing cost of the electronic device increase.

Accordingly, it is an object of the present invention to provide a testing apparatus and a testing method, which are capable of overcoming the above drawbacks accompanying the conventional art. The above object can be achieved by combinations described in the independent claims. The dependent claims define further advantageous and exemplary combinations of the present invention.

SUMMARY OF THE INVENTION

In order to solve the problems above, according to the first aspect of the present invention, a testing apparatus for performing a setup testing or a hold testing on a device under test ("DUT") storing a given data signal according to a given clock signal is provided, wherein the testing apparatus includes a timing generating unit for generating sequentially a plurality of timing signals having different timings during the setup testing or the hold testing on the basis of a fist offset value given before starting the setup testing or the hold testing; a pattern generating unit for generating the clock signal and the data signal; a pattern formatting unit for shifting the phase of the data signal with respect to the clock signal sequentially according to the timing signals sequentially generated and providing the DUT with the clock signal and the phase-shifted data signal sequentially; and a determining module for acquiring a setup time or a hold time of the DUT on the basis of storage data which are the data signals stored by the DUT.

The timing generating unit may generate the timing signals showing different timings at every time the pattern formatting unit provides the DUT with the data signal. The timing generating unit may generate the plurality of timing signals sequentially on the basis of the first offset value and a phase shift amount of each of the plurality of timing signals is increased by the first offset value.

The timing generating unit may include an offset memory for storing the first offset value; a calculating module for calculating added values increasing sequentially by the first offset value on the basis of the first offset value stored by the offset memory; and a signal generating module for generating sequentially the timing signals phase-shifted according to the added values.

The determining module may include an analysis memory for retrieving the storage data stored by the DUT at every time the pattern formatting unit provides the DUT with the clock signal and the data signal and storing each of the retrieved storage data and the phase shift amount so that they correspond with each other.

The analysis memory may store an order in which the corresponding storage data is provided to the DUT during the setup testing or the hold testing as the phase shift amount.

The determining module may compare each of the storage data with the an expectation value signal which should be retrieved from the DUT and acquire a setup time or a hold time necessary for the DUT's storing the data signal on the basis of the comparison result of the storage data and the expectation value signal and the corresponding phase shift amount.

The calculating module may include a timing memory for storing an initial value of the added value; a shift value acquiring unit for acquiring shift amounts sequentially increasing by the first offset value; and an adding unit for adding the initial value to the shift amount and acquiring the added values sequentially.

The shift value acquiring unit may include a first outputting unit for receiving the first offset value and outputting the first offset value received according to a given reference clock as a first output signal; a first acquiring unit for acquiring a second offset value showing a value twice as large as the first offset value; a second outputting unit for receiving the second offset value and outputting the second offset value received according to a given reference clock as a second output signal; a second acquiring unit for adding the first offset value stored in the offset memory to the second output signal and providing the first outputting unit with the result as a new first offset value; and a third acquiring unit for adding the second offset value acquired by the first acquiring unit to the second output signal and providing the second outputting unit with the result as a new second offset value, and output sequentially the first output signal and the second output signal as the added values.

The analysis memory may store a value showing how many times the first offset value is added to acquire the corresponding added value as the phase shift amount.

According to the second aspect of the present invention, a testing method for performing a setup testing or a hold testing on a device under test ("DUT") storing a given data signal according to a given clock signal is provided, wherein the testing method includes a timing generating step of generating sequentially a plurality of timing signals having different timings during the setup testing or the hold testing on the basis of a fist offset value given before starting the setup testing or the hold testing; a pattern generating step of generating the clock signal and the data signal; a pattern formatting step of shifting the phase of the data signal with respect to the clock signal sequentially according to the timing signals sequentially generated and providing the DUT with the clock signal and the phase-shifted data signal sequentially; and a determining step of acquiring a setup time or a hold time of the DUT on the basis of storage data which are the data signals stored by the DUT.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
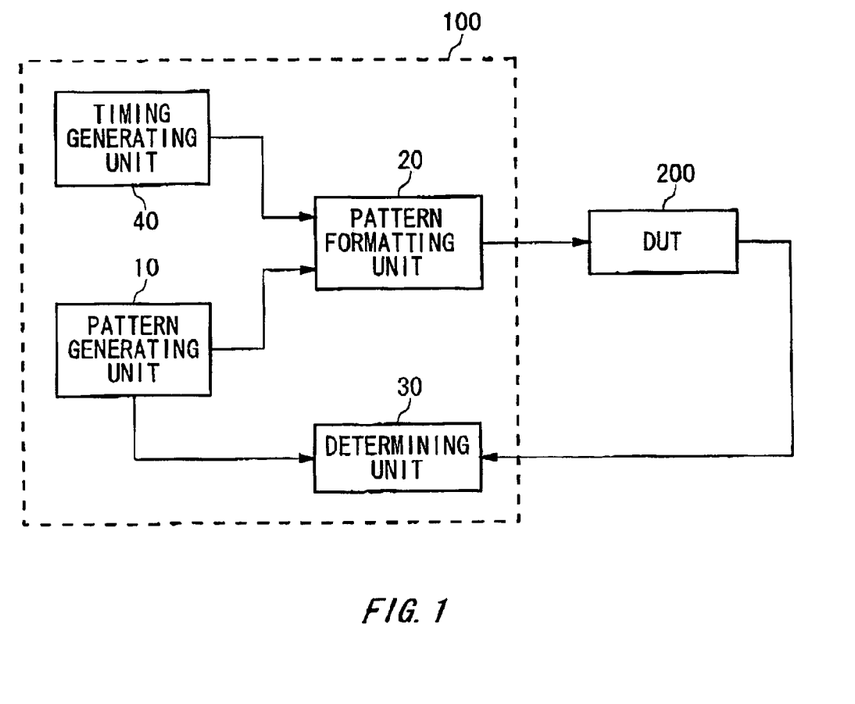
FIG. 1 shows an example of the configuration of a testing apparatus 100 according to an embodiment of the present invention.

FIG. 1 shows an example of the configuration of a testing apparatus 100 according to an embodiment of the present invention. The testing apparatus 100 performs a setup testing or a hold testing on a device under test ("DUT") 200 storing a data signal given according to a given clock signal. Further, the testing apparatus 100 includes a timing generating unit 40, a pattern generating unit 10, a pattern formatting unit 20, and a determining module 30.

The timing generating unit 40 generates a plurality of timing signals having different timings sequentially during the setup testing or the hold testing on the basis of a first offset value given before the setup testing or the hold testing is started. For example, the timing generating unit 40 generates the plurality of timing signals sequentially by calculation on the basis of the first offset value. According to the present example, the timing generating unit 40 generates a plurality of timing signals on the basis of the first offset value wherein a phase shift amount of each timing signal increases by the first offset value.

Here, the "before the setup testing or the hold testing is started" refers to before beginning to provide the DUT 200 with a clock signal and a data signal to measure a setup time or a hold time. Further, the "during the setup testing or the hold testing" refers to from starting to finishing providing the DUT 200 with all clock signals and data signals necessary for measuring the setup time or the hold time.

The pattern generating unit 10 generates the clock signal and the data signal to be provided to the DUT 200. The pattern formatting unit 20 shifts phase of the data signals with respect to the clock signals sequentially according to the timing signals sequentially generated by the timing generating unit 40 and provides the DUT 200 with the clock signals and the phase-shifted data signals sequentially.

The DUT 200 stores the data signals given according to the given clock signals sequentially. The determining module 30 acquires the setup time or the hold time necessary for writing the data signals on the DUT on the basis of storage data which are the data signals sequentially stored in the DUT 200. In other words, the determining module 30 determines whether or not the data signals are correctly stored in the DUT for each of the clock signals and the phase-shifted data signals and acquires the setup time and the hold time on the basis of the determination result.

According to the testing apparatus 100 of the present example, it is not required to store a plurality of timing setting data corresponding to a plurality of timing signals which should be generated because the plurality of timing signals are generated on the basis of the first offset value. Consequently, it is possible to reduce memory volume comparing with the conventional testing apparatus. Further, since it is not required to rewrite the timing setting data during the testing, the setup testing and the hold testing can be performed effectively.

Figure 2:
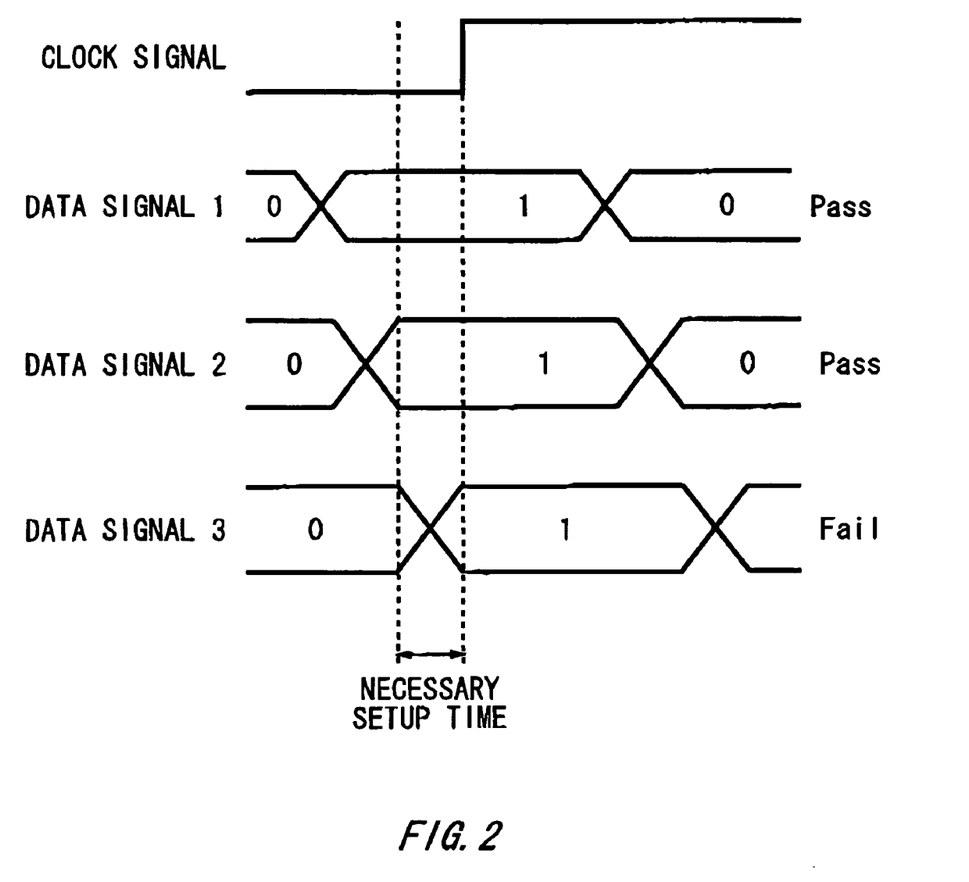
FIG. 2 describes an example of a setup testing.

FIG. 2 describes an example of the setup testing. For the setup testing, the testing apparatus 100 provides the DUT 200 with the clock signal and the data signal of which phase gradually shifts with respect to the clock signal. The DUT 200 stores a value of the data signal according to an edge of the clock signal. As shown in FIG. 2, the testing apparatus 100 retrieves the storage data stored by the DUT 200 according to each of the clock signals and the phase-shifted data signals and measures the setup time necessary for the DUT 200 to store the data signal on the basis of the retrieved storage data.

The testing apparatus 100 determines whether or not the retrieved storage data has the same value as that of the provided data signal and shifts the phase of the data signal until the storage data and the data signal have different values. For example, the testing apparatus 100 shifts the phase of the data signal so that a period from output of the data signal to a rising of the clock signal becomes shorter. Thus, in case the storage data and the data signal have different values, it is possible to measure the setup time from a phase shift amount of the data signal which is provided just before the storage data and the data signal have different values.

Figure 3:
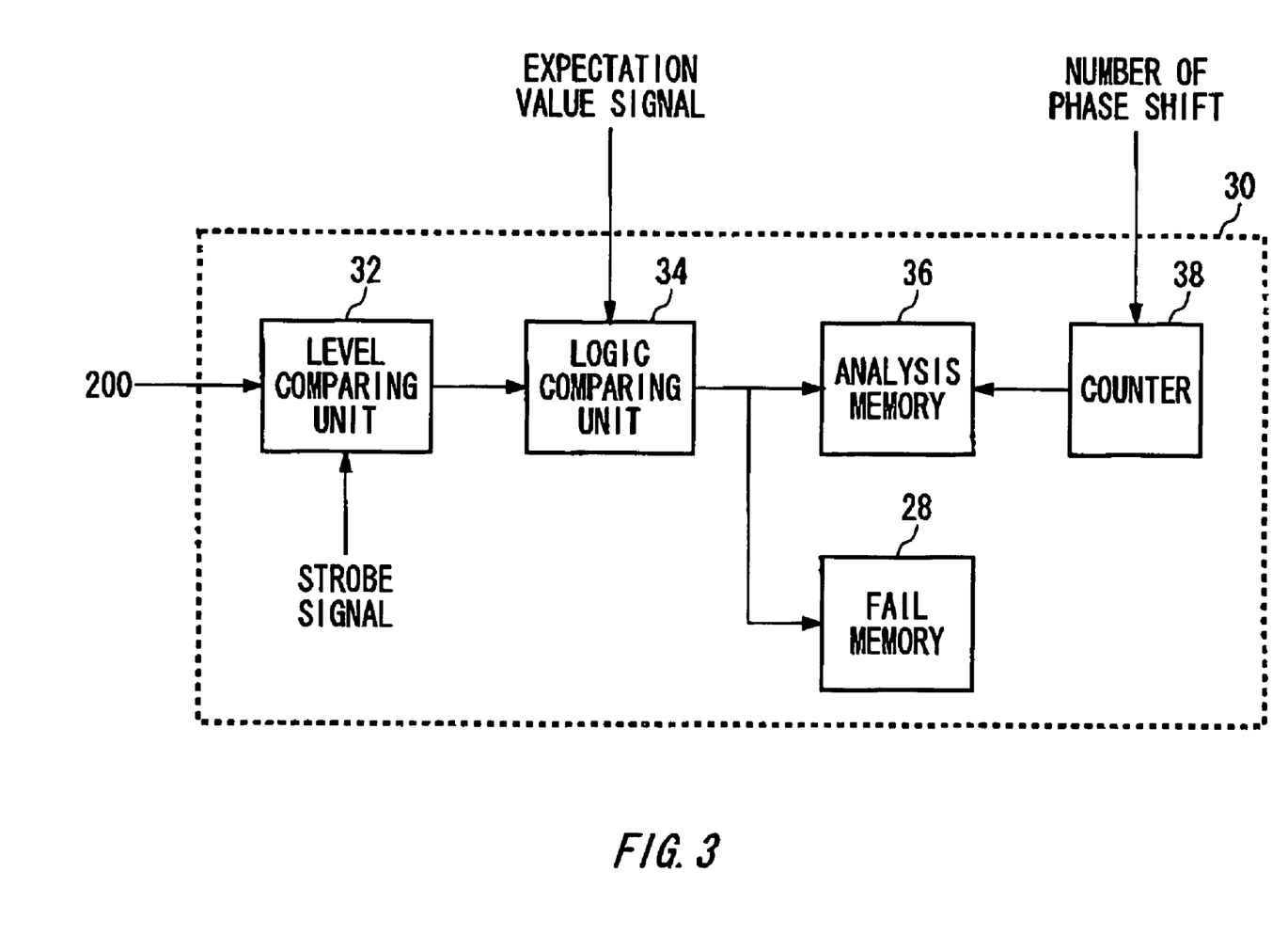
FIG. 3 shows an example of the configuration of a determining module 30.

FIG. 3 shows an example of the configuration of the determining module 30. The determining module 30 includes a level comparing unit 32, a logic comparing unit 34, an analysis memory, a fail memory 28, and a counter 38.

The level comparing unit 32 receives the storage data of the DUT sequentially and detects values of the storage data. For example, the level comparing unit 32 is provided with a strobe signal and it is detected whether the value of the storage data is a H level or an L level at a timing of the strobe signal.

The logic comparing unit 34 compares the value of the storage data detected by the level comparing unit 32 with an expectation value signal to judge whether the value of the storage data and the expectation value signal are the same. The expectation value signal may be the data signal provided to the DUT 200.

The fail memory 28 stores the comparison result of the logic comparing unit 34. Further, the determining module 30 retrieves the storage data stored by the DUT 200 at every time the pattern formatting unit 20 provides the DUT 200 with the clock signal and the data signal. The analysis memory 36 stores each of the retrieved storage data and the phase shift amount of the provided data signal so that they correspond with each other. Further, in case the comparison result changes from that the storage data is the same as the expectation value signal to that storage data is not the same as the expectation value signal, the analysis memory 36 may store the phase shift amount of the corresponding data signal.

The counter 38 is provided with a signal at every time the phase of the data signal is shifted and counts how many times the phase of the data signal is shifted. The analysis memory 36 stores the counted number of the signals as a phase shift amount. It is possible to acquire the phase shift amount of the data signal by multiplying the number of times the phase is shifted by the first offset value.

Further, the counter 38 may count an order in which the corresponding data signal is provided to the DUT 200 for the setup testing or the hold testing. In this case, the analysis memory 36 stores the order in which the corresponding data signal is provided to the DUT 200 for the setup testing or the hold testing as the phase shift amount. The determining module 30 may further include a means for acquiring the setup time or the hold time on the basis of the phase shift amount stored by the analysis memory 36.

Figure 4:
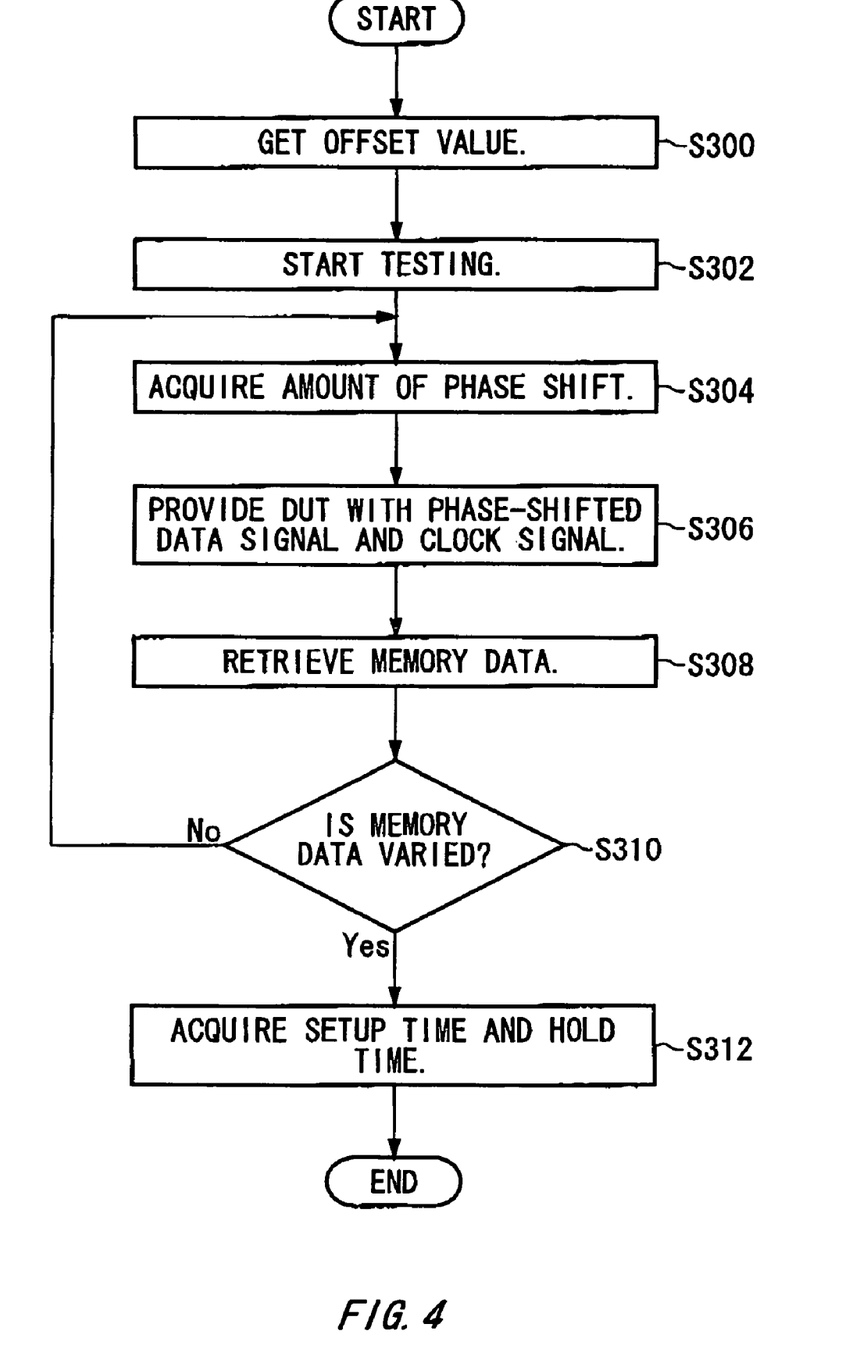
FIG. 4 is a flow chart describing an example of operation of the testing apparatus 100.

FIG. 4 is a flow chart describing an example of operation of the testing apparatus 100. First, the first offset value is gotten in S300. Then, the setup test or the hold test is started in S302.

Then, in S304, the timing generating unit 40 acquires the phase shift amount of the data signal which should be provided to the DUT 200. Then, in S306, the pattern formatting unit 20 shifts the phase of the data signal on the basis of the phase shift amount acquired in the S304. Then, the DUT 200 is provided with the clock signal and the phase-shifted data signal.

Then, in S308, the storage data stored by the DUT 200 is retrieved and provided to the determining module 30. Then, in S310, the determining module 30 determines whether or not the retrieved storage data is varied. In other words, the determining module 30 determines whether the retrieved storage data is varied from a state where the retrieved storage data is the same as an expectation value to a state where the retrieved storage data is not the same as an expectation value. Then, in case the retrieved storage data is varied so as not to be the same as the expectation value, the determining module 30 acquires the setup time or the hold time on the basis of the phase shift amount of the corresponding data signal in S312.

In case the retrieved storage data is the same as the expectation value, a phase shift amount of a data signal which should be provided next to the DUT 200 is acquired and the above procedures are repeated until the storage data is varied.

Figure 5:
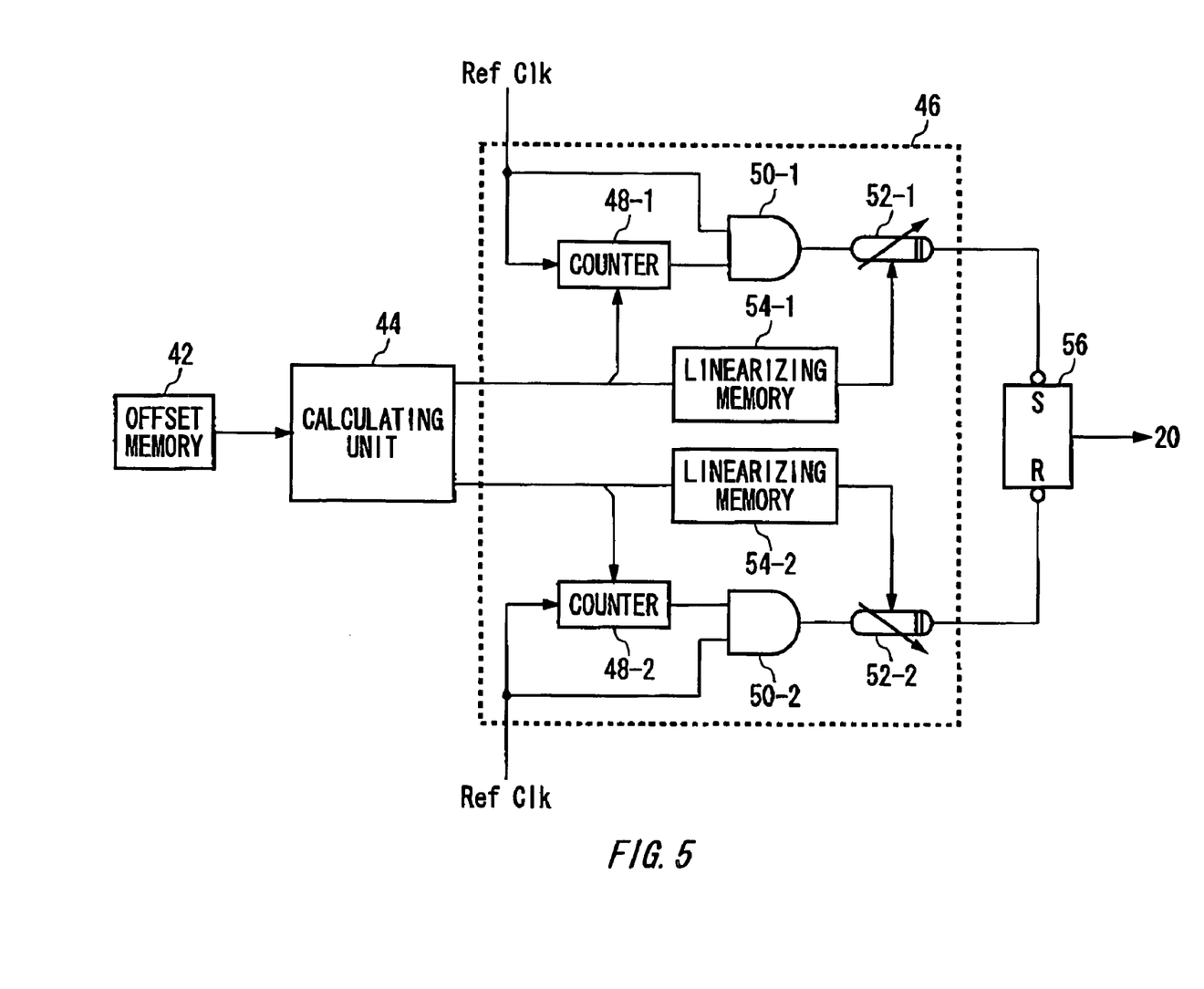
FIG. 5 shows an example of the configuration of a timing generating unit 40.

FIG. 5 shows an example of the configuration of the timing generating unit 40. The timing generating unit 40 includes an offset memory 42, a calculating module 44, a signal generating module 46, and a set/reset latch 56.

The offset memory 42 stores the first offset value. The calculating module 44 acquires added values increasing by the first offset value sequentially on the basis of the value of the first offset memory stored by the offset memory 42. The signal generating module 46 and the set/reset latch 56 generate sequentially the timing signals phase-shifted according to the added values sequentially acquired by the calculating module 44. According to the present example, the signal generating module 46 and the set/reset latch 56 delay a reference clock according to the added value and generate the timing signal.

The signal generating module 46 generates a set signal and a reset signal for generating a rising edge of the timing signal. The set/reset latch 56 generates the timing signal on the basis of the set signal and the reset signal.

Further, the calculating module 44 generates an added value for the set signal and an added value for the reset signal in order to make the signal generating module 46 generate the set signal and the reset signal. The signal generating module 46 includes a counter 48-1, a linearizing memory 54-1, an AND circuit 50-1, and a variable delay circuit 52-1 for generating the set signal.

The calculating module 44 outputs an added value which is a digital data comprised of a plurality of bits. The counter 48-1 receives the most significant bit of the added value and the reference clock, counts the rising edge or the falling edge, and in case the edge of the reference clock is shown in the most significant bit of the added value, outputs one (1) to the AND circuit 50-1. The AND circuit 50-1 provides the variable delay circuit 52-1 with a predetermined signal at every time the AND circuit 50-1 receives one (1) from the counter 48-1. According to the present example, the AND circuit 50-1 provides the variable delay circuit 52-1 with a reference clock. Thus, the counter 48-1 and the AND circuit 50-1 generate a delay which is an integer times as large as the period of the reference clock.

The linearizing memory 54-1 receives the least significant bit of the added value and controls a delay amount of the variable delay circuit 52-1 on the basis of the least significant bit of the added value. Thus, the linearizing memory 54-1 and the variable delay circuit 52-1 generate a minute delay smaller than the period of the reference clock out of delay amounts shown in the added value. The variable delay circuit 52-1 provides a set terminal of the set/reset latch 56 with the delayed signal.

Further, the signal generating module 46 includes a counter 48-2, a linearizing memory 54-2, an AND circuit 50-2, and a variable delay circuit 52-2 for generating the reset signal. Thus, in a similar way the set signal is generated, the reset signal is generated and provided to a reset terminal of the set/reset latch 56 with the reset signal.

According to the timing generating unit 40 of the present example, the calculating module 44 acquires the added values increasing gradually on the basis of the first offset value stored by the offset memory 42, and the signal generating module 46 and the set/reset latch 56 generate the timing signal on the basis of the added value. Thus, it is possible to generate easily the timing signal of which phase shift gradually. Further, since the timing signal is generated and thus it is enough to just store the first offset value, it is possible to reduce memory volume comparing with the case of storing all timings of the timing signal. Further, since it is not required to rewrite the first offset value stored in the offset memory 42, it is possible to generate the timing signals successively. Therefore, it is possible to conduct the hold test or the reset test without stopping.

Figure 6:
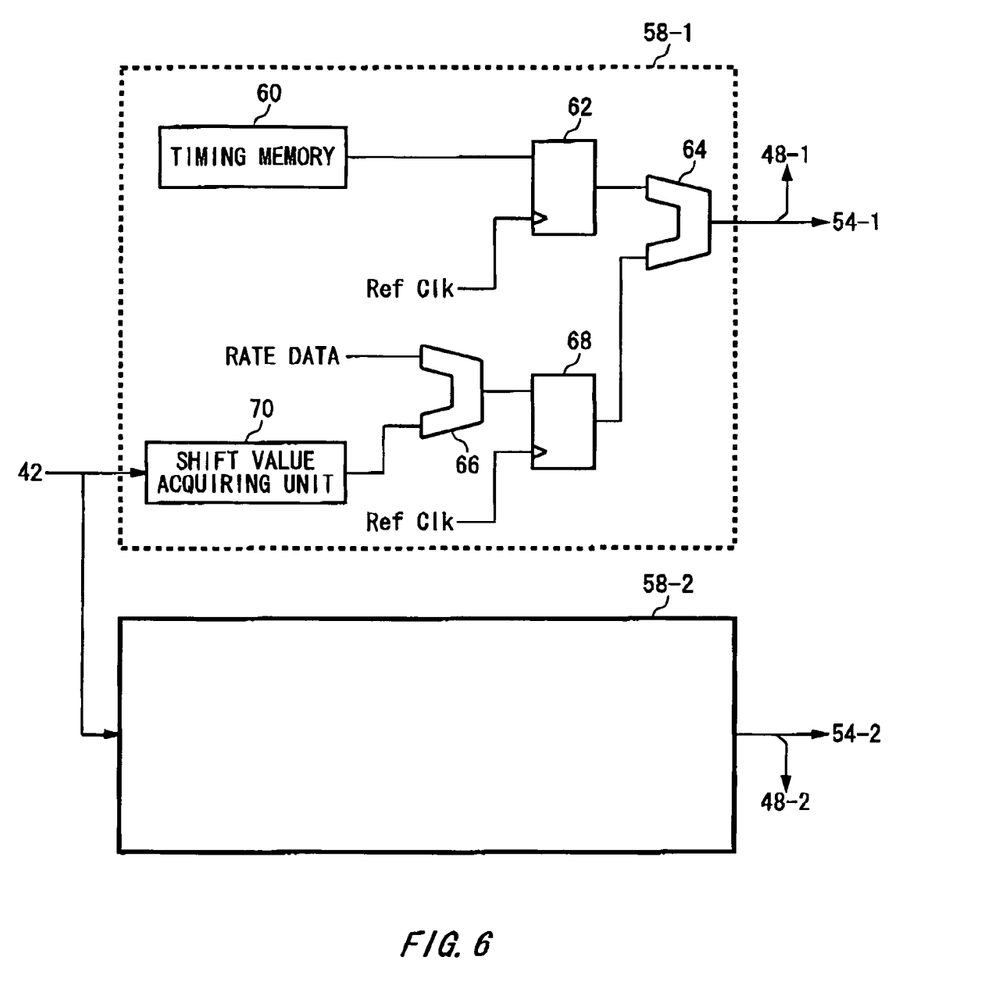
FIG. 6 shows an example of the configuration of a calculating module 44.

FIG. 6 shows an example of the configuration of the calculating module 44. The calculating module 44 includes a calculating module for set signal 58-1 for calculating the added value for the set signal and a calculating module for reset signal 58-2 for calculating the added value for the reset signal.

The calculating module for set signal 58-1 includes a timing memory 60, a shift value acquiring unit 70, a flip-flop 62, an adding unit 66, a flip-flop 68, and an adding unit 64. The timing memory 60 stores an initial value of the added value for set signal which should be generated. Further, the shift value acquiring unit 70 acquires a shift value increasing gradually on the basis of the value of the first offset value stored by the offset memory 42.

The adding unit 66 adds a value of a given rate data to the shift value acquired by the shift value acquiring unit 70 and provides the flip-flop 68 with the result. Further, the timing memory 60 provides the flip-flop 62 with the stored initial value. For example, in case the added value for set signal is output as a digital signal of 18 bits, the timing memory 60 stores an initial value of 18 bits and the shift value acquiring unit 70 outputs the shift value which is a digital signal of nine (9) bits.

The flip-flop 62 and the flip-flop 68 provide the adding unit 64 with the received data synchronously. The adding unit 64 adds the shift value to the least significant bit of the initial value and outputs the result. For example, the adding unit 64 adds the shift value to the least significant 9 bits of the initial value and outputs the added value for set signal.

Further, the calculating module for reset signal 58-2 has the same configuration as that of the calculating module for set signal 58-1. According to the present example, the timing memories 60 of the calculating module for set signal 58-1 and the calculating module for reset signal 58-2 are provided with the same initial values and each of the shift value acquiring units 70 acquires the shift value substantially the same as the other. Further, the adding unit 66 of the adding unit for reset signal 58-2 is provided with a rate data which is larger by a pulse width of the timing signal to be generated than the rate data provided to the adding unit 66 of the adding unit for set signal 58-1. Thus, it is possible that the set/reset latch 56 generates a timing signal having a desired pulse width. In this case, the calculating module for set signal 58-1 and the calculating module for reset signal 58-2 may have a common timing memory and a common shift value acquiring unit 70.

Further, according to another example, the calculating module 44 may not have the calculating module for reset signal 58-2. In this case, the most significant bit of the added value acquired by the calculating module for set signal 58-1 is provided to the counters 48-1 and 48-2 and the least significant bit is provided to the linearizing memories 54-1 and 54-2. For example, in case the linearizing memories 54-1 and 54-2 are provided with the same values, it is possible to generate a timing signal having a pulse width of a predetermined time by initializing or adjusting each linearizing memory 54 in advance so that the variable delay circuit 52-2 generates a delay larger than the variable delay circuit 52-1 by a predetermined time.

According to the calculating module 44 described with respect to FIG. 6, it is possible to efficiently acquire the added values increasing gradually. It is possible to reduce memory volume, for example, comparing with the case of previously storing all added values to be acquired in the timing memory 60. Further, although the calculating module 44 according to the present example has one calculating module 58-1 for set signal for generating the set signal and one calculating module 58-2 for reset signal for generating the reset signal, the calculating module 44 according to another example may have two calculating units 58-1 for set signal and two calculating units 58-2 for reset signal. In this case, the calculating module 44 can operate at a higher speed by making two calculating units 58-1 for set signal subject to interleave operation and two calculating units 58-2 for reset signal subject to interleave operation.

Figure 7:
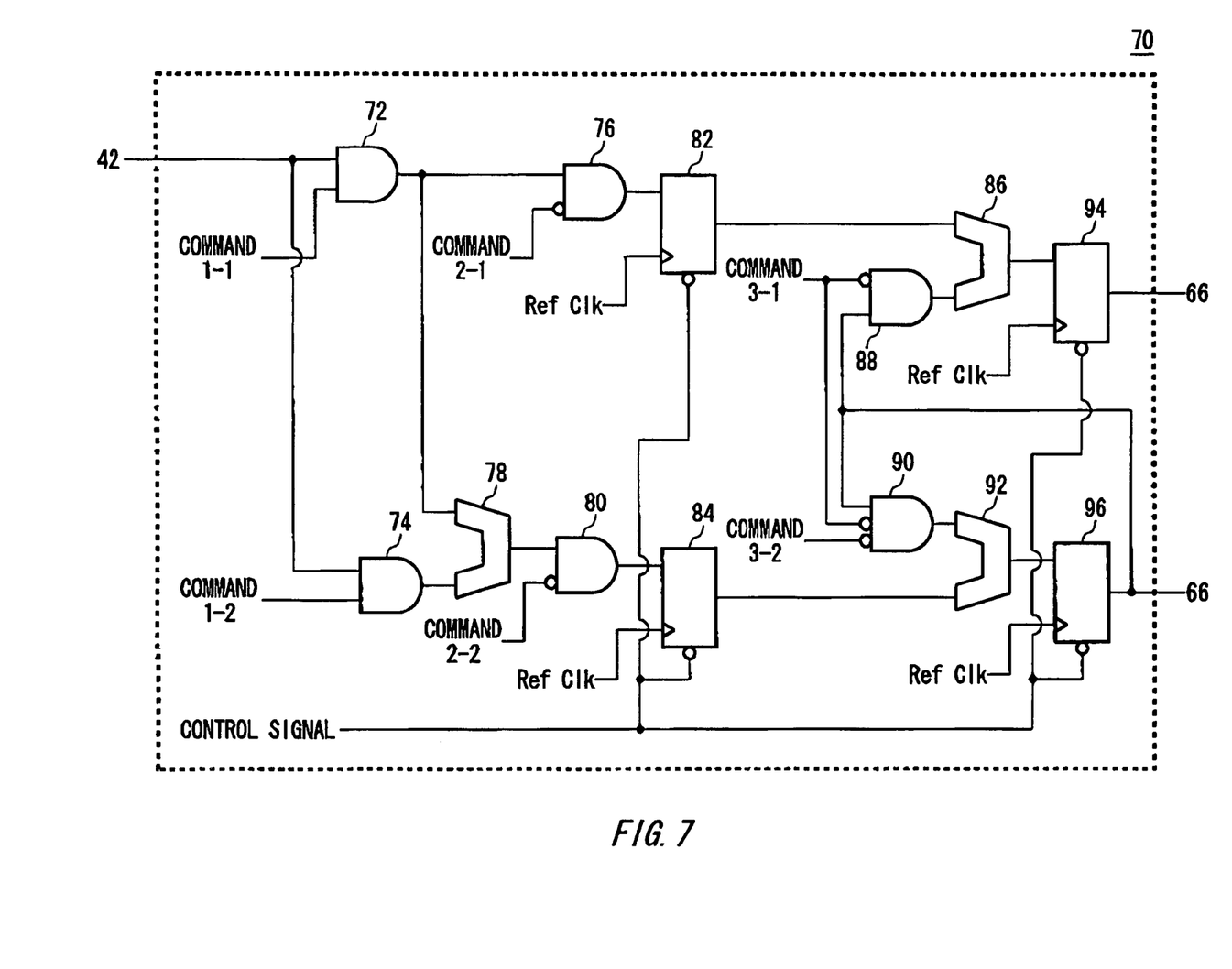
FIG. 7 shows an example of the configuration of a shift value acquiring unit 70.

FIG. 7 shows an example of the configuration of the shift value acquiring unit 70. The shift value acquiring unit 70 includes a plurality of AND circuits 72, 74, 76, 80, 88, and 90, a plurality of adding units 78, 86, and 92, and a plurality of flip-flops 82, 84, 94, and 96.

The AND circuit 72 receives the first offset value from the offset memory 42 and outputs it to the AND circuit 76 and the adding unit 78. Further, the AND circuit 72 is provided with a command signal 1-1 to control whether or not to output the received first offset value. In case of not outputting the received first offset value, the AND circuit 72 is provided with zero (0) as the command signal 1-1.

The AND circuit 74 receives the first offset value from the offset memory 42 and outputs it to the adding unit 78. Further, the AND circuit 74 is provided with a command signal 1-2 to control whether or not to output the received first offset value.

The adding unit 78 which is an example of a first adding unit according to the present invention adds the signal output by the AND circuit 74 to the signal output by the AND circuit 72 and outputs the result to the AND circuit 80.

Therefore, in case the command signals 1-1 and 1-2 are one (1), the adding unit 78 outputs a second offset value twice as large as the first offset value.

The AND circuit 76 outputs the received signal to the flip-flop 82. Further, the AND circuit 76 is provided with a command signal 2-1 to control whether or not to output the received signal to the flip-flop 82. Further, the AND circuit 80 outputs the received signal to the flip-flop 84. The AND circuit 80 is provided with a command signal 2-2 to control whether or not to output the received signal to the flip-flop 84. According to the present example, zero (0) is given as the command signals 2-1 and 2-2.

The flip-flops 82 and 84 hold and synchronize the received signals and output them. According to the present example, the flip-flop 82 holds the first offset value and the flip-flop 84 holds the second offset value.

The flip-flop 94 which is an example of a first outputting unit according to the present invention receives the first offset value and outputs the first offset value as a first output signal according to the reference clock. The flip-flop 96 which is an example of a second outputting unit according to the present invention receives the second offset value and outputs the second offset value as a second output signal according to the reference clock.

The AND circuit 88 receives the second output signal and outputs it to the adding unit 86. Further, the AND circuit 88 is provided with a command signal 3-1 to control whether or not to output the received second output signal. In addition, the AND circuit 90 receives the second output signal and outputs it to the adding unit 92. The AND circuit 90 is provided with the command signal 3-1 and a command signal 3-2 to control whether or not to output the received second output signal.

The adding unit 86 which is an example of a second adding unit according to the present invention adds the first offset value held by the flip-flop 82 to the second output signal and outputs the result to the flip-flop 94 as a new first offset value. Further, the adding unit 92 adds the second offset value held by the flip-flop 84 to the second output signal and outputs the result to the flip-flop 96 as a new second offset value.

The flip-flops 94 and 96 output sequentially the received first offset value and the received second offset value as the first output signal and the second output signal, respectively. The shift value acquiring unit 70 outputs each of the first and second output signals which are output by the flip-flops 94 and 96, respectively, as an added value of each other. Further, each of the flip-flops of the shift value acquiring unit 70 is provided with a control signal for controlling whether or not to reset the held value.

According to the shift value acquiring unit 70 of the present example, it is possible to easily generate the added values increasing gradually. Further, by controlling each of the control signals, it is possible to generate various added values. Further, it is possible to judge how many times each of the added values is generated by adding the first offset value by combination of each of the command signals. Thus, it is possible to acquire the phase shift amount of the generated timing signal by counting how many times zero (0) or one (1) is input to each of the command signals. Thus, the counter described with respect to FIG. 3 may count how many times one (1) is input as each command signal.

Further, although the shift value acquiring unit 70 of the present example generates the added values gradually increasing, the shift value acquiring unit 70 according to another example may generate added values gradually decreasing. It is possible to generate the added values gradually decreasing by the same constitution as that of the shift value acquiring unit 70 of the present example.

Figure 8:
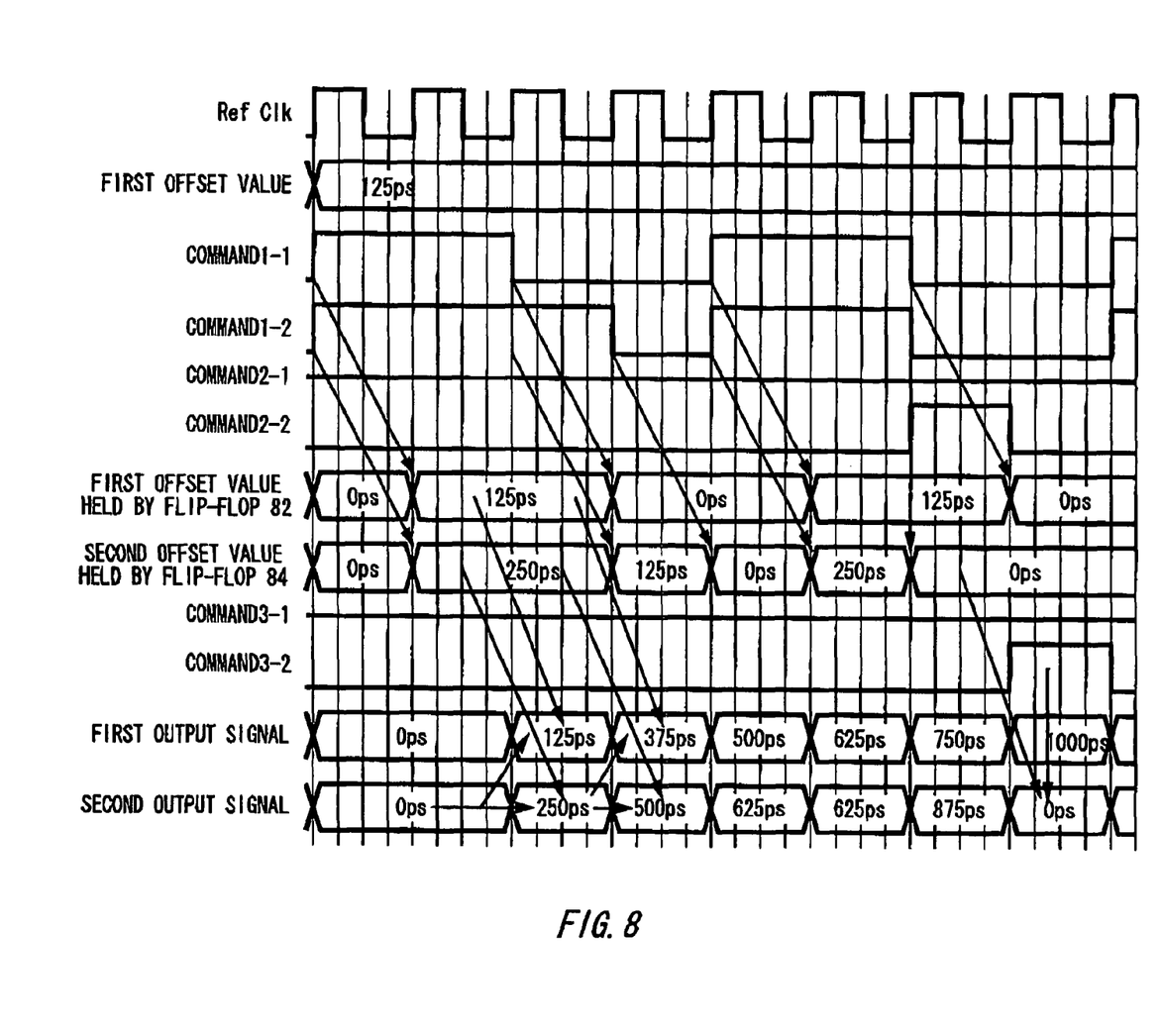
FIG. 8 is a timing chart showing an example of operation of the shift value acquiring unit 70 described in FIG. 7.

FIG. 8 is a timing chart showing an example of operation of the shift value acquiring unit 70 described in FIG. 7. According to the present example, 125 ps is stored in the offset memory 42 as the first offset value. As shown in FIG. 8, the testing apparatus 100 varies the first offset value held by the flip-flop 82 and the second offset value held by the flip-flop 84 by combination of the command signals 1-1, 1-2, 2-1, and 2-2.

The flip-flops 94 and 96 outputs the first output signal and the second output signal on the basis of the first offset value held by the flip-flop 82, the second offset value held by the flip-flop 84, the command signals 3-1 and 3-2.

As describe above, according to the shift value acquiring unit of the present example, it is possible to generate easily the added values gradually increasing.

As obvious from the above description, according to the testing apparatus of the present invention, it is possible to perform the setup testing or the hold testing efficiently.

Although the present invention has been described by way of exemplary embodiments, it should be understood that those skilled in the art might make many changes and substitutions without departing from the spirit and the scope of the present invention, which is defined only by the appended claims.

What is claimed is:

1. A testing apparatus for performing a setup testing or a hold testing on a device under test storing a given data signal according to a given clock signal comprising:
    a timing generating unit for generating sequentially a plurality of timing signals having different timings during the setup testing or the hold testing on the basis of a first offset value given before starting the setup testing or the hold testing;
    a pattern generating unit for generating the clock signal and the data signal; a pattern formatting unit for shifting the phase of the data signal with respect to the clock signal sequentially according to the timing signals sequentially generated and providing the device under test with the clock signal and the phase-shifted data signal sequentially; and
    a determining module for acquiring a setup time or a hold time of the device under test on the basis of storage data which are the data signals stored by the device under test,
    wherein said determining module compares each of the storage data which should be retrieved from the device under test with an expectation value signal and acquires the setup time or the hold time necessary for the devices under test storing the data signal on the basis of a comparison result of the storage data and the expectation value signal and the corresponding phase shift amount.

2. The testing apparatus as claimed in claim 1, wherein said timing generating unit generates the timing signals showing different timings at every time said pattern formatting unit provides the device under test with the data signal.

3. The testing apparatus as claimed in claim 2, wherein said timing generating unit generates the plurality of timing signals sequentially on the basis of the first offset value and a phase shift amount of each of the plurality of timing signals is increased by the first offset value.

4. The testing apparatus as claimed in claim 3, wherein said timing generating unit comprises an offset memory for storing the first offset value; a calculating module for calculating added values increasing sequentially by the first offset value on the basis of the first offset value stored by said offset memory; and a signal generating module for generating sequentially the timing signals phase-shifted according to the added values.

5. The testing apparatus as claimed in claim 4, wherein said determining module comprises an analysis memory for retrieving the storage data stored by the device under test at every time said pattern formatting unit provides the device under test with the clock signal and the data signal and storing each of the retrieved storage data and the phase shift amount so that they correspond with each other.

6. The testing apparatus as claimed in claim 5, wherein said analysis memory stores an order in which the corresponding storage data is provided to the device under test during the setup testing or the hold testing as the phase shift amount.

7. The testing apparatus as claimed in claim 5, wherein said calculating module comprises a timing memory for storing an initial value of the added value; a shift value acquiring unit for acquiring shift amounts sequentially increasing by the first offset value; and an adding unit for adding the initial value to the shift amount and acquiring the added values sequentially.

8. The testing apparatus as claimed in claim 7, wherein said shift value acquiring unit comprises a first outputting unit for receiving the first offset value and outputting the first offset value received according to a given reference clock as a first output signal; a first acquiring unit for acquiring a second offset value showing a value twice as large as the first offset value; a second outputting unit for receiving the second offset value and outputting the second offset value received according to a given reference clock as a second output signal; a second acquiring unit for adding the first offset value stored in said offset memory to the second output signal and providing said first outputting unit with the result as a new first offset value; and a third acquiring unit for adding the second offset value acquired by said first acquiring unit to the second output signal and providing said second outputting unit with the result as a new second offset value, and outputs sequentially the first output signal and the second output signal as the added values.

9. The testing apparatus as claimed in claim 8, wherein said analysis memory stores a value showing how many times the first offset value is added to acquire the corresponding added value as the phase shift amount.

10. A testing method for performing a setup testing or a hold testing on a device under test storing a given data signal according to a given clock signal comprising;

a timing generating step of generating sequentially a plurality of timing signals having different timings during the setup testing or the hold testing on the basis of a first offset value given before starting the setup testing or the hold testing;

a pattern generating step of generating the clock signal and the data signal;

a pattern formatting step of shifting the phase of the data signal with respect to the clock signal sequentially according to the timing signals sequentially generated and providing the device under test with the clock signal and the phase-shifted data signal sequentially; and a determining step of acquiring a setup time or a hold time of the device under test on the basis of storage data which are the data signals stored by the device under test, wherein said determining module compares each of the storage data which should be retrieved from the device under test with an expectation value signal and acquires the setup time or the hold time necessary for the devices under test storing the data signal on the basis of a comparison result of the storage data and the expectation value signal and the corresponding phase shift amount.

* * * * *